United States Patent [19]

Nakamura et al.

[11] Patent Number: 4,562,372
[45] Date of Patent: Dec. 31, 1985

[54] PIEZOELECTRIC VIBRATING ELEMENT HAVING A RECTANGULAR CONFIGURATION

[75] Inventors: Takeshi Nakamura, Uji; Ikuo Matsumoto, Nagaokakyo; Kenji Ando, Kawasaki, all of Japan

[73] Assignee: Murata Manufacturing Co., Ltd., Japan

[21] Appl. No.: 682,165

[22] Filed: Dec. 17, 1984

[30] Foreign Application Priority Data

Dec. 26, 1983 [JP] Japan .................................. 58-248825

[51] Int. Cl.⁴ ............................................ H01L 41/08
[52] U.S. Cl. ..................................... 310/321; 310/368
[58] Field of Search .............................. 310/321-324, 310/312, 367, 368; 333/186, 189, 190

[56] References Cited

U.S. PATENT DOCUMENTS 3,209,176  9/1965  Paley ................................. 310/321 X
3,634,787  1/1972  Newell .............................. 310/321 X
4,469,975  9/1984  Nakamura ......................... 310/321

Primary Examiner—Mark O. Budd
Attorney, Agent, or Firm—Ostrolenk, Faber, Gerb & Soffen

[57] ABSTRACT

A vibrating element for the vibration under an expansion mode has a substrate made of a constant modulus alloy and has a rectangular configuration defined by opposite long sides and opposite short sides, a thin piezoelectric film deposited on the substrate, and a vibration electrode film deposited on the piezoelectric film. When an equivalent circuit of the vibrating element can be defined as including a resonance inductance L, a resistance R and a series capacitance Cs, which are connected in series and a parallel capacitance Cp, which is connected parallelly to the series connection of L, R and Cs, a ratio of short side to long side of the substrate is selected to have values around points where a ratio of parallel capacitance Cp to serial capacitance Cs shows negative peaks.

2 Claims, 4 Drawing Figures

PIEZOELECTRIC VIBRATING ELEMENT HAVING A RECTANGULAR CONFIGURATION

BACKGROUND OF THE INVENTION

1. Field of the Invention

The present invention relates to a vibrating element capable of vibrating under an expansion mode and, more particularly, to a piezoelectric vibrator defined by a thin piezoelectric film deposited on a substrate made of a constant modulus alloy and a vibration electrode film deposited on the piezoelectric film.

2. Description of the Prior Art

Piezoelectric vibrators of the above described type generally have a circular or square configuration. In such a case, the relationship between the vibration frequency F0 and the expanding direction length A, which is equal to the diameter of the vibrator when it is circular, or is equal to one side of the vibrator when it is square, can be given as follows:

$$F0 = \frac{1}{2A} \sqrt{\frac{C}{D}},$$

wherein C is a constant as follows, $$C = \frac{1 - P}{(1 - 2P)(1 + P)} E,$$

P is Poisson's ratio, E is Young's modulus, D is density and A is the distance between opposite edges of the vibrator for determining the vibration frequency. As is apparent from the above equation, the size of the vibrating element becomes smaller as the vibration frequency increases. Thus, when a vibrating element that vibrates at a high frequency is required, it is very difficult to handle the element, because its size is very small.

SUMMARY OF THE INVENTION

The present invention has been developed with a view to substantially solving the above described disadvantages and has for its essential object to provide an improved vibrating element which has a size sufficiently large for handling even when the vibrating element has a high vibration frequency.

It is a further object of the present invention to provide a vibrating element which can readily be manufactured at a low cost.

In accomplishing these and other objects, a vibrating element according to the present invention has a rectangular configuration defined by opposite long sides and opposite short sides. An equivalent circuit of the vibrating element can be defined as including a resonance inductance L, a resistance R and a series capacitance Cs which are connected in series and a parallel capacitance Cp which is connected in parallel with the series connection of L, R and Cs, the ratio of the length long side to the length short side of the substrate is selected to have values around points where the ratio of the parallel capacitance Cp to the serial capacitance Cs shows negative peaks.

BRIEF DESCRIPTION OF THE DRAWINGS

These and other objects and features of the present invention will become apparent from the following description taken in conjunction with a preferred embodiment thereof with reference to the accompanying drawings, throughout which like parts are designated by like reference numerals, and in which.

DESCRIPTION OF THE PREFERRED EMBODIMENTS

Figure 1:
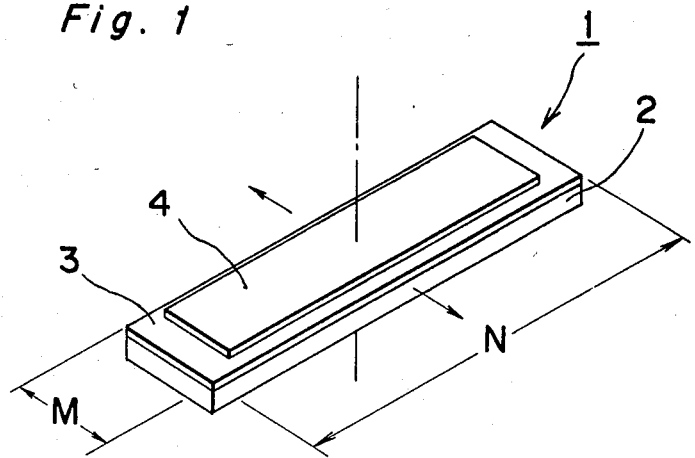
FIG. 1 is a perspective view of a vibrating element according to a preferred embodiment of the present invention.

Referring to FIG. 1, a piezoelectric resonator is shown according to a preferred embodiment of the present invention. A piezoelectric vibrating element 1 comprises a vibration substrate 2 made of, e.g., Elinvar and a piezoelectric film 3, made of, e.g. ZnO, deposited on substrate 2 through the step of, for example, sputtering. A vibration electrode film 4 is further deposited on piezoelectric film 3 through the step of, for example, vapor deposition.

The vibrating element 1 has an elongated rectangular configuration defined by short sides having a length M and long sides having a length N. When in use, vibration takes place such that the element expands and contracts in the short side direction, as indicated by arrows.

Figure 2:
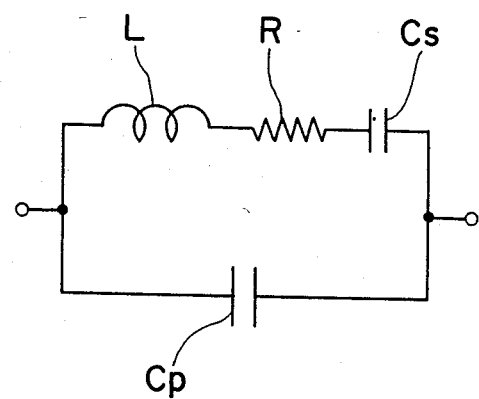
FIG. 2 is a diagram showing an equivalent circuit of the element shown in FIG. 1.

Referring to FIG. 2, an equivalent circuit of vibrating element 1 is shown. The equivalent circuit comprises a resonance inductance L, a resistance R and a series with each other capacitance Cs, which are connected in series, and a parallel capacitance Cp, which is connected in parallel with the series connection of L, R and Cs. The vibration characteristics can be evaluated by using a ratio $\phi$ ($=Cp/Cs$), such that the smaller the ratio $\phi$, the better the vibration characteristics.

Figure 3:
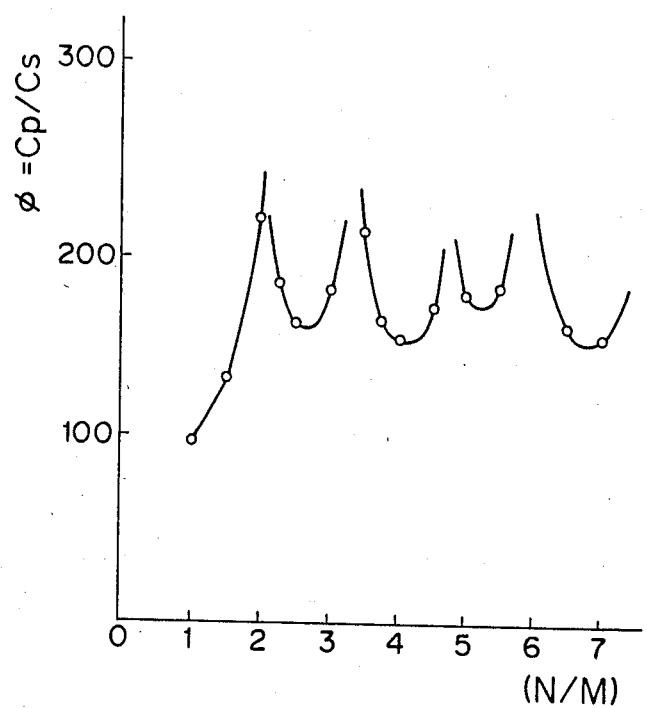
FIG. 3 is a graph showing a relationship between a ratio of long and short sides and a ratio of capacitances indicated in FIG. 2.

According to the tests carried out by the present inventors, a predetermined relation is obtained between the ratio $\phi$ and a ratio N/M, as indicated in the graph of FIG. 3. According to the test results shown in FIG. 3, four negative peak points along the ordinate are observed that take the local minimum values of the ratio $\phi$. Accordingly, when the lengths M and N are so selected that the ratio N/M is equal to or nearly equal to these four negative peak points, a vibrating element 1 having a relatively small ratio $\phi$ can be realized. Thus, according to the preferred embodiment, the ratio N/M should be within the four regions, such as 2.5–3.0, 3.6–4.6, 5.0–5.5 and 6.25–7.25.

In addition, a region 1–1.75 of the ratio N/M, corresponding to the left skirt portion in the graph of FIG. 3, also provides a small ratio $\phi$ and, therefore, it should be considered as the same as the above four regions. The skirt portion, however, represents a vibrating element of a square configuration and, therefore, the skirt portion should not be included within the scope of the present invention.

Figure 4:
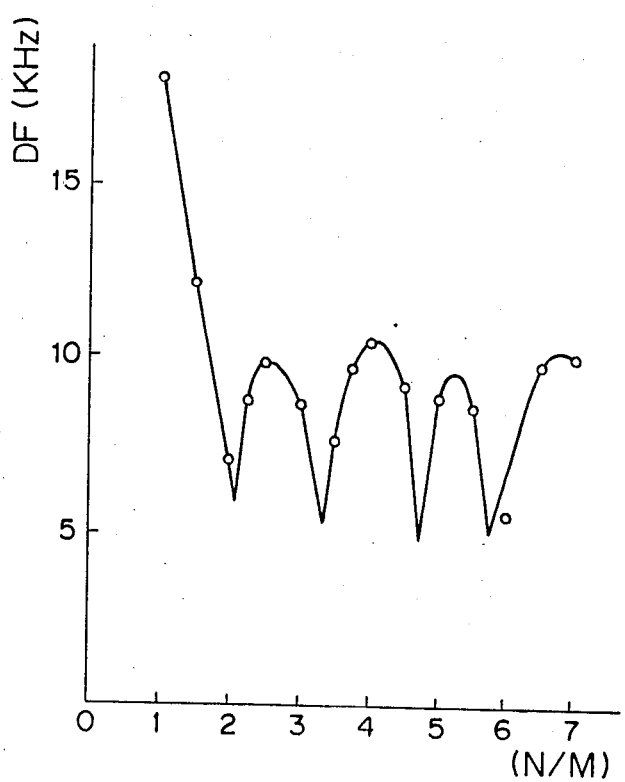
FIG. 4 is a graph showing a relationship between a ratio of long and short sides and a difference DF of antiresonant frequency to resonant frequency.

Referring to FIG. 4, the relationship between the ratio N/M and a difference DF of antiresonant frequency to resonant frequency is shown. In the above described four regions 2.5–3.0, 3.6–4.6, 5.0–5.5 and 6.25–7.25, the difference DF is relatively great, indicating that the vibration characteristics are good in such four regions.

According to the present invention, since vibrating element 1 can be formed in an elongated rectangular configuration with a ratio (N/M) of its long side to short side being so fixed that the ratio $\phi$ of parallel capacitance Cp to serial capacitance Cs is relatively small, a rectangular vibrating element 1, other than square and of a desired size, can be designed, so long as the ratio N/M is within predetermined ranges. Thus, the handling of the vibrating element 1 can be improved. For example, vibrating element 1 can be supported at the nodes with high accuracy.

Although the present invention has been fully described with reference to a preferred embodiment, many modifications and variations thereof will now be apparent to those skilled in the art, and the scope of the present invention is therefore to be limited not by the details of the preferred embodiment described above, but only by the terms of the appended claims.

What is claimed is:

1. An expansion mode vibrating element defined by an equivalent circuit including a resonance inductance L, a resistance R and a series capacitance Cs, which elements are connected in series, and a parallel capacitance Cp, which is connected in parallel with the series connection of L, R and Cs, said vibrating element comprising:

a substrate made of a constant modulus alloy and having a rectangular configuration defined by opposite long sides and opposite short sides;

a thin piezoelectric film deposited on said substrate; and a vibration electrode film deposited on said peizoelectric film;

the ratio of the length of the long side to the length of the short side of said substrate being selected to have a value around a point where the ratio of the parallel capacitance Cp to the serial capacitance Cs is at a negative peak.

2. The vibrating element of claim 1, wherein said value of said ratio of the length of the long side to the length of the short side falls within the ratios 2.5–3.0, 3.6–4.6, 5.0–5.5 and 6.25–7.25.

* * * * *